US 7,302,656 B2

(12) United States Patent
Weber et al.

(10) Patent No.: US 7,302,656 B2
(45) Date of Patent: Nov. 27, 2007

(54) METHOD AND SYSTEM FOR PERFORMING FUNCTIONAL VERIFICATION OF LOGIC CIRCUITS

(75) Inventors: Kai Weber, Boeblingen (DE); Christian Jacobi, Schoenaich (DE); Nico Gulden, Unterwirbach (DE); Viresh Paruthi, Austin, TX (US); Klaus Keuerleber, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/385,928

(22) Filed: Mar. 21, 2006

(65) Prior Publication Data

US 2007/0011633 A1 Jan. 11, 2007

(30) Foreign Application Priority Data

Jun. 21, 2005 (EP) ................... 05105480

(51) Int. Cl.
*G06F 9/45* (2006.01)
(52) U.S. Cl. ............. 716/5; 716/4; 716/7; 716/12; 716/18
(58) Field of Classification Search .......... 716/4, 716/5, 7, 12, 18
See application file for complete search history.

(56) References Cited

U.S. PATENT DOCUMENTS

| 6,606,721 | B1* | 8/2003 | Gowin et al. ............... 714/728 |
| 6,611,947 | B1* | 8/2003 | Higgins et al. ............... 716/5 |
| 7,073,143 | B1* | 7/2006 | Huang ............................ 716/5 |
| 2002/0046391 | A1* | 4/2002 | Ito et al. ...................... 716/18 |
| 2002/0138812 | A1* | 9/2002 | Johannsen .................... 716/5 |
| 2003/0208730 | A1* | 11/2003 | Singhal et al. ................ 716/4 |
| 2004/0123254 | A1* | 6/2004 | Geist et al. ................... 716/4 |
| 2005/0251768 | A1* | 11/2005 | Iima ............................. 716/4 |
| 2006/0129952 | A1* | 6/2006 | Baumgartner et al. ......... 716/2 |

OTHER PUBLICATIONS

J. M. Ludden et al., "Functional Verification of the POWER4 Microprocessor and POWER4 Multiprocessor Systems", IBM Journal of Research and Development, vol. 46, No. 1, Jan. 2002, pp. 53-76.

(Continued)

*Primary Examiner*—Jack Chiang
*Assistant Examiner*—Nha Nguyen
(74) *Attorney, Agent, or Firm*—Michael R. Nichols; Casimer K. Salys (57) ABSTRACT

A method, a computer program product and a system for performing functional verification logic circuits. The invention enables the functional formal verification of a hardware logic design by replacing the parts that cannot be formally verified easily. In one form the invention is applied to a logic design including a multiplier circuit. The multiplier is replaced (51) by pseudo inputs. The input signal values of the multiplier circuit are determined (54) automatically from a counterexample (53) delivered (52) by a functional formal verification system for a modified design where the multiplier is replaced by pseudo signals. The input signal values are combined (55) with other known inputs to form a test case (56) file that can be used by a logic simulator to analyse the counterexample (52) on the unmodified hardware design including the multiplier.

12 Claims, 6 Drawing Sheets

OTHER PUBLICATIONS

Kupriyanov et al., "High-Speed Event-Driven RTL Compiled Simulation", Proc. Of the 4$^{th}$ Int. Workshop on Computer Systems:Architectures, Modelling, and Simulation 2004, pp. 519-529.

Zohar Manna et al, "The Temporal Logic of Reactive and Concurrent Systems", 1992 Springer-Verlag New York, Inc., pp. 179-213.

IEEE Std 754-1985, "IEEE Standard for Binary Floating-Point Arithmetic", Institute of Electrical and Electronics Engineers, Inc. NY, pp. 114.

C. Jacobi et al, Automatic Format Verification of Fused-Multiply-Add FPUs, Proc. Of the 2005 Design, Automation and Test in Europe Conf and Exhibition, (DATE'05), pp. 1-6.

R. Kaivola et al, "Formal Verification of the Pentium 4 Floating-Point Multiplier", Proc. Of the 2002 Design, Automation and Test in Europe Conf and Exhibition (DATE'02), pp. 1-8.

J.M. Pollard, "A Monte Carlo Method for Factorization", BIT 15 (1975), pp. 331-334.

* cited by examiner

METHOD AND SYSTEM FOR PERFORMING FUNCTIONAL VERIFICATION OF LOGIC CIRCUITS

BACKGROUND OF THE INVENTION

The present invention relates to a method, a system, and a computer program product for performing functional verification of logic circuits.

Digital logic circuits implement a logic function of a digital hardware. Such circuits represent the core of any computing processing unit. Thus, before a logic circuit or "hardware design" is constructed in real hardware, its respective logic design must be tested and the proper operation thereof has to be verified against a design specification. This task is called functional verification and described for example in J. M. Ludden et al.: "Functional verification of the POWER4 microprocessor and POWER4 multiprocessor systems", IBM Journal of Research and Development, Vol. 46 No. 1, January 2002.

In one step of the functional verification process, the hardware logic design is represented as a so-called register-transfer level netlist, or netlist. Register transfers take place during the execution of each hardware cycle: Input values are read from a set of storage elements (registers, memory cells, etc.), a computation is performed on these values, and the result is assigned to set of storage elements. A netlist can be generated from a high-level description of the hardware circuit in a standard hardware description language such as VHDL. Logic simulation systems are able to use this netlist in order to simulate the behaviour of the hardware logic design for a given set of input signal values.

A netlist can be treated as a directed graph structure with simple building blocks as nodes and signals as connecting arcs; see Kupriyanov et al.: "High Speed Event-Driven RTL Compiled Simulation", Proc. of the $4^{TH}$. Int. Workshop on Computer Systems: Architectures, Modelling, and Simulation 2004. The building blocks are often called boxes and the signals are called nets, hence the name netlist. Among the simple building blocks are Boolean gates, registers, arrays, latches, and black boxes representing special logical functions.

Assume a simple exemplary circuit has a plurality of 16 input signals. Then a plurality of 2 to the power of 16 different input signal values exist, which should be tested in total for the correct operation of the circuit, or its logic model, respectively. But today's hardware designs are much more complex. Even single sections of a hardware design may comprise hundreds, or several thousands of input signal values. This enormous input signal value space cannot be verified by logic simulation completely. Regression runs of logic simulations using randomly generated values for the input signals of the hardware design are used instead.

A special verification technique that addresses the complete input signal value space is called functional formal verification. But also functional formal verification of hardware logic designs at the register-transfer level is inherently difficult using automated methods. Many automated functional formal verification methods are based on algorithms using Binary Decision Diagrams (BDDs) to represent the hardware logic design, where a temporal logic formula is verified for a given hardware logic design. Systems implementing these methods are called a (symbolic) model checker. Model checkers take benefit from the fact that a hardware logic design can be represented as a finite state machine, for which the complete finite state space is verified.

A temporal logic formula allows specifying the behaviour of a system over time; see for example Mana/Pnueli: "The Temporal Logic of Reactive and Concurrent Systems", Vol. 1, Springer 1995. For example for logic design verification the Computational Tree Logic can be used to specify the signal value of a certain signal at certain discrete points in time (cycles), e.g. a signal has a value of 1 in the next cycle, a signal has a value of 0 in all following cycles, a signal has a value of 1 in at least one of the following cycles etc.

If the model checker finds a specific combination of signal values for the inputs for a netlist of a design under test for which a temporal logic formula is not fulfilled then it produces a counterexample. A counterexample is a list of signals and their values of either 0 or 1 at certain cycles. A model checker delivers a counterexample with a minimal number of cycles such that the temporal logic formula is not fulfilled.

Other automated functional formal verification methods are based on algorithms using conjunctive normal forms (CNF) to represent the hardware logic design, where it is checked whether a CNF can be satisfied (SAT) for a given hardware logic design. Except for special cases, attempts to formally verify a hardware logic design result in either memory (BDD-based algorithms) or runtime (SAT-based algorithms) explosions.

Floating-point circuits are notoriously difficult to design and verify. For verification, simulation barely offers adequate coverage. For a complete state of the art floating point unit it takes many months to perform a reasonable number of logic simulation regression runs. Therefore, in logic simulation a large set of special test cases is used to maximize the test coverage for the logic design of the floating point unit.

For floating point multiplication, an adding process for exponential parts of the multiplied values, a multiplying process for the mantissa parts of the multiplied values, a normalizing process for the product of the multiplication of the mantissa, and a rounding process are performed to finally obtain the result of the multiplication. Such floating point multiplication methods are described in the IEEE 754, "IEEE Standard for Binary Floating-Point Arithmetic". Binary multiplication is discussed in detail in chapter 5 of the textbook "Arithmetic Operations in Digital Computers" by R. K. Richards.

Any hardware logic design containing a binary multiplier circuit is difficult to verify using functional formal verification methods. As described in C. Jacobi et al.: "Automatic Formal Verification of Fused-Multiply-Add FPUs", Proc. of the 2005 Design, Automation and Test in Europe Conference and Exhibition (DATE'05), the usual method to overcome this problem is to mask out the multiplier from the design by overwriting the multiplier output signals with non-deterministic (random) values. These non-deterministic values mimic the behaviour of the multiplier such that any logic connected to the outputs of the multiplier behaves as if the multiplier itself would be part of the design.

The multiplier is then verified by other means such as simulation and adapted formal verification methods. In many cases the multiplier itself is simple enough to be verified quickly using logic simulation methods. A special functional formal verification method is shown in R. Kaivola, N. Narasimhan: "Formal Verification of the Pentium©4 Floating-Point Multiplier", Proc. of the 2002 Design, Automation and Test in Europe Conference and Exhibition (DATE'02). The disadvantage of this method is that it comprises many manual steps that are specific for a given design. Therefore, a verification framework that has been developed using this method is difficult or even impossible to use in different hardware development projects.

With the actual multiplier being replaced by non-deterministic overwrites, the connection to the multiplier input signal values is lost. Therefore it is complicated to reconstruct the input signal values of the multiplier if a design error has been detected during the verification of the modified hardware logic design with the multiplier masked out, such that these input signal values would produce the same design error in the unmodified design.

Typically, it is a lot easier to detect the cause of the design error if all the input signal values of the design are known. One way to analyse the problem then is to perform a logic simulation using all the input signal values that lead to the design error.

SUMMARY OF THE INVENTION

It is therefore an object of the present invention, to provide a method for performing functional verification of logic circuits that is improved over the prior art and a corresponding computer system and a computer program product.

The present invention allows performing the functional formal verification of hardware logic designs by replacing the parts of the design that cannot be easily formally verified with other parts that emulate the behaviour of the replaced parts. Especially, the method can be used automatically for any hardware logic design.

In one embodiment of the invention the method is applied to a hardware logic design including a multiplier circuit for which it is assumed that the multiplier is implemented correctly.

The advantages of the present invention are achieved by determining the input signal values of the multiplier circuit from a given set of output signal values of the multiplier and a given set of constraints for the input signal values.

The output signal values of the multiplier will be defined by using a counterexample that is produced automatically by a verification system, for example a model checker. Such a counterexample is typically given as a signal value trace for the hardware logic design, starting with a given set of input signal values for the design, and ending with the signal value combination in the design that does not match the design specification.

The test for a counterexample will be done on a modified hardware logic design, where the multiplier is removed by replacing its input and output signals by pseudo-signals. These pseudo-signals are non-deterministic (random) values and mimic the potential set of output signal values of the multiplier.

The output signal values of the multiplier circuit will be treated as an integer number. Then the prime factors of this number are determined. In a preferred embodiment of the invention, a prime number test is performed before the prime number factorisation as a time saving method.

Among the prime factors, a combination is determined which satisfies the given set of constraints for the input signal values, which are treated as two integer numbers. Such a combination is used to generate these two integer numbers, which are the result of the multiplication of the prime factors from the determined prime factor combination.

The two numbers are then treated again as input signal values for the multiplier and combined with the other input signal values for the hardware logic design from the counterexample to form a test case file. This test case file will then be used by a logic simulation system in order to simulate the unmodified hardware logic design including the multiplier circuit. In this simulation a complete signal value trace for the hardware logic design can be generated and used to find the root cause of the design error.

BRIEF DESCRIPTION OF THE DRAWINGS

For the present invention, and the advantages thereof, reference is now made to the following description taken in conjunction with the accompanying drawings.

DETAILED DESCRIPTION

Figure 1A:
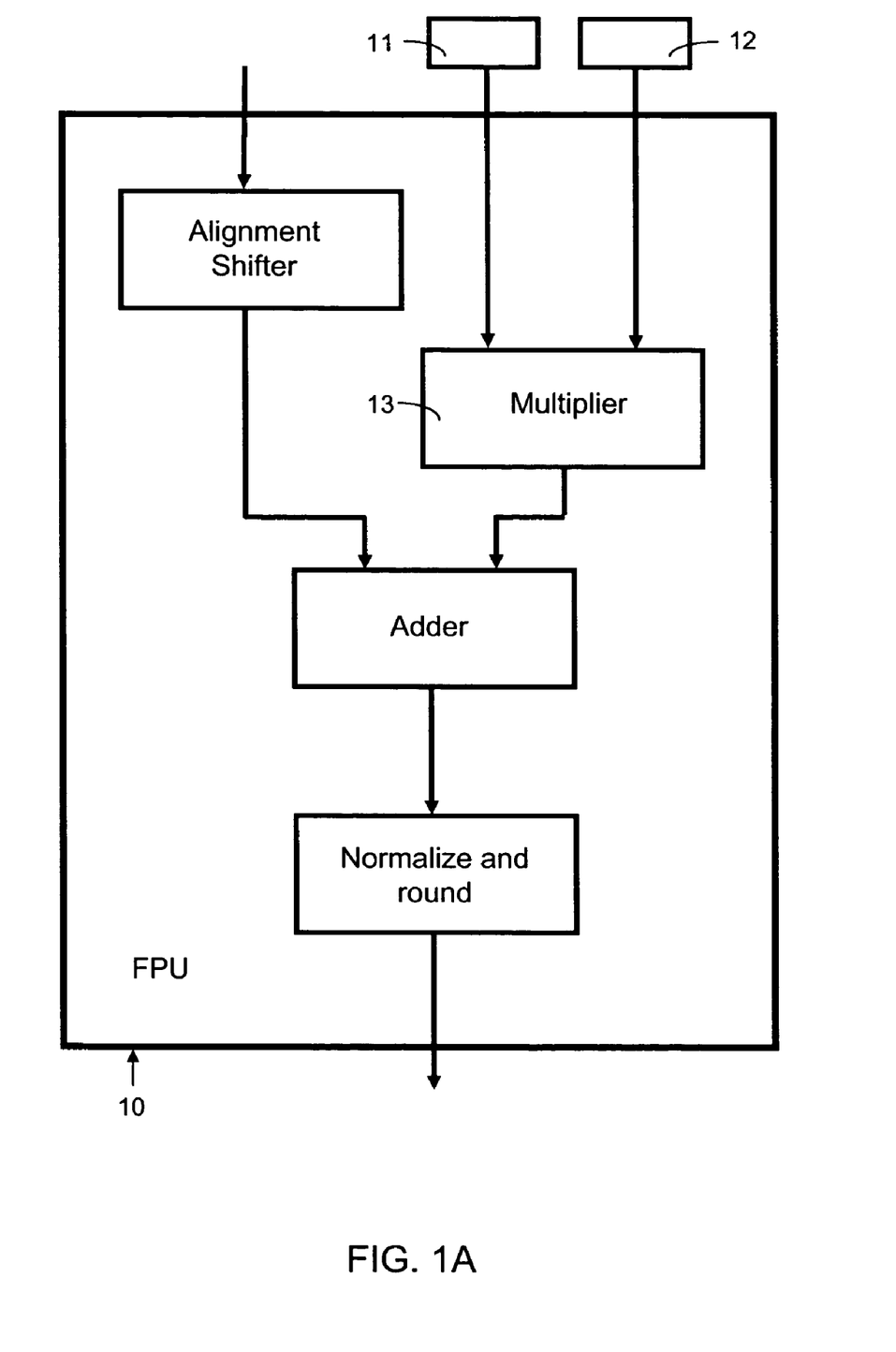
FIG. 1A: Is a block diagram of a floating point unit in a processor.

FIG. 1A illustrates a floating point unit (FPU) 10 supporting the IEEE 754 standard in a processor. This floating point unit 10 implements the multiplication of two floating point numbers stored in the registers 11 and 12 by a multiplier 13 and is part of a subsystem of the processor that is responsible for the implementation of the IEEE 754 standard.

Figure 1B:
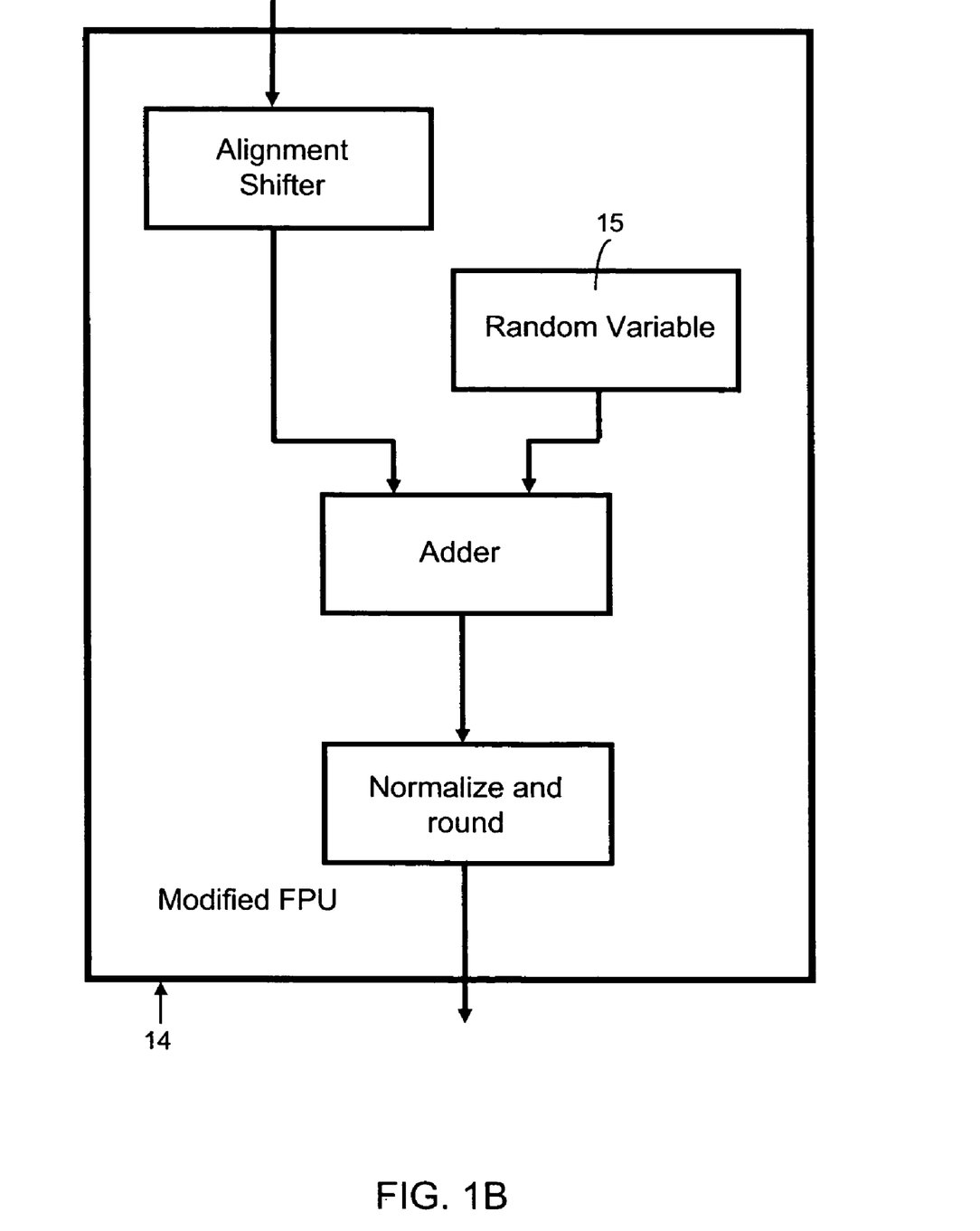
FIG. 1B: Is a block diagram of a floating point unit in a processor for test purposes according to the present invention.

For the present invention, the netlist representation of the FPU 10 is modified such that the multiplier 13 and its input floating point numbers 11 and 12 are replaced by a random variable building block 15. FIG. 1B illustrates the modified floating point unit 14. The random variable building block 15 is a special node in the directed graph structure of the netlist that is interpreted as signals with random values by a model checker.

Figure 2A:
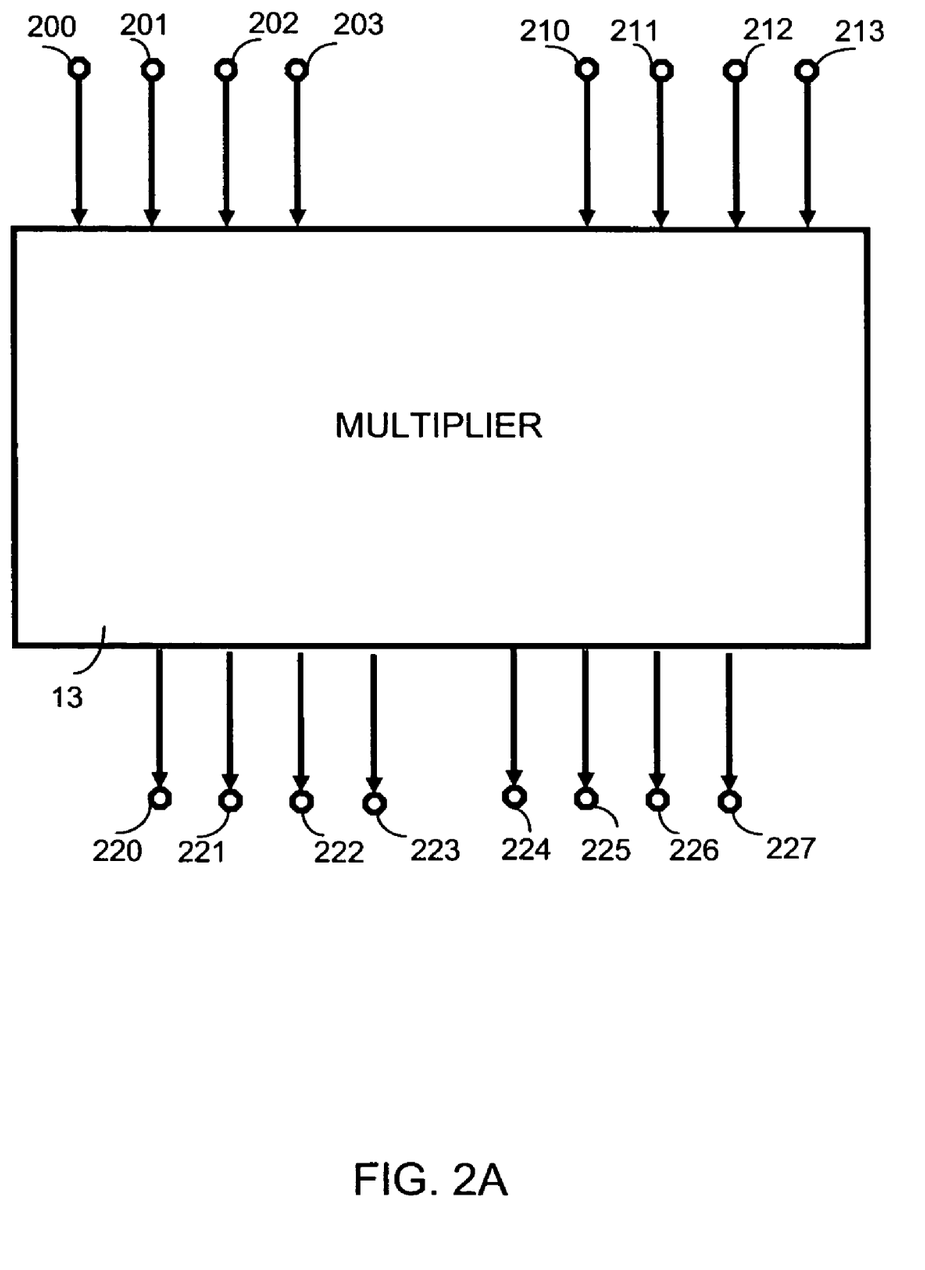
FIG. 2A: Is a block diagram of a the inputs and outputs of a multiplier.

The inputs of the multiplier 13 can be separated in two groups related to the two numbers that will be multiplied by the multiplier 13. For a floating point number to be handled by the FPU 10, the multiplier 13 is multiplying the mantissa parts only. FIG. 2A is an exemplary illustration for these two groups for the netlist representation of the FPU 10. In the first group are the input signals 200, 201, 202, and 203. In the second group are the input signals 210, 211, 212, and 213. The outputs of the multiplier 13 are the output signals 220, 221, 222, 223, 224, 225, 226, 227. The input and output signals of the multiplier 13 are nets in the directed graph structure of the netlist of the FPU 10. The actual netlist representation of the multiplier 13 is not shown in FIG. 2A. This representation is itself a directed graph structure that represents the actual logic design implementation of the multiplier at the register-transfer level.

Figure 2B:
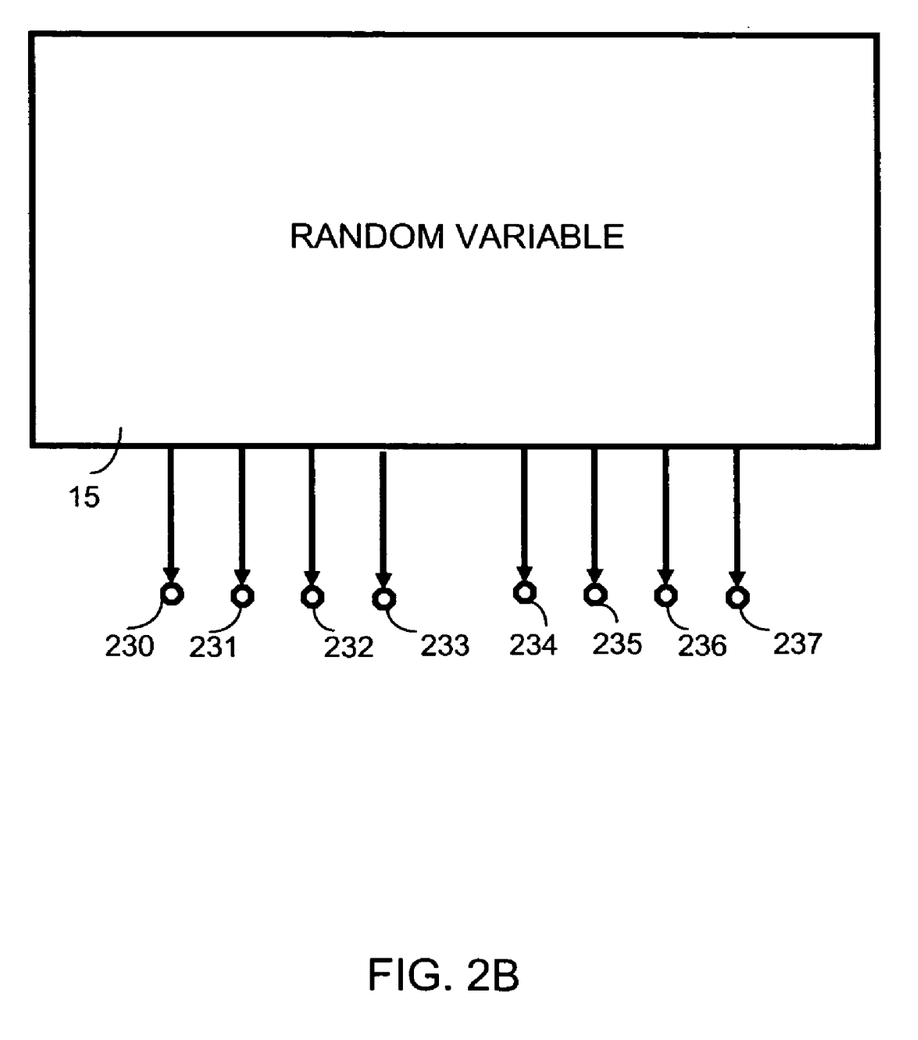
FIG. 2B: Is a block diagram of a building block to replace a multiplier in accordance with the present invention.

For the above described modification of the netlist of the FPU 10 that results in the modified FPU 14 the two groups of input signals are removed from the directed graph structure and the random variable building block node 15 as shown in FIG. 2B is added as a node to the graph structure. The output signals 220, 221, 222, 223, 224, 225, 226, 227 of the multiplier 13 are replaced by the output signals 230, 231, 232, 233, 234, 235, 236, 237 of the random variable building block 15 respectively.

In a preferred embodiment of the invention, the random variable building block 15 is a node in the graph structure of the netlist representation of the modified FPU 14 and not represented as a directed graph structure within the graph structure of the modified FPU 14 as is the case for the multiplier 13 because the building block 15 serves as a place holder for verification purposes, which cannot be implemented as hardware. In other embodiments a netlist can be used instead, which allows to model the behaviour of the multiplier 13. The only requirement to the replacement netlist is that it can be easily formally verified.

Since there are no arcs left in the graph representing the netlist of the modified FPU 14 that connect the graph representing the multiplier 13 with the graph representing the other logic circuits of the FPU 10, the multiplier has no influence to the behaviour of the modified FPU 14. Therefore the graph structure representing the multiplier 13 can be removed in the graph structure representing the modified FPU 14; hence the multiplier 13 can be removed in the netlist representation of the modified FPU 14.

As known from the mathematical graph theory, a directed graph is a pair G=(V, E), where V is a finite set of nodes and E is a subset of V×V, a relation on V called the set of arcs. A path in a graph G is a finite sequence of arcs (u_0, v_0), . . . ,(u_n, v_n) such that v_(i−1)=u_i. In a preferred embodiment of the invention all the nodes and arcs of the graph structure representing the FPU 10 will be removed from the graph structure representing the modified FPU 14, for which a path exists that ends in one of the input signals 200, 201, 202, 203, 210, 211, 212, 213 of the multiplier 13. The sub-graph that is defined by all these paths is also called the cone-of-influence.

The modification step of the netlist representation of the FPU 10 that leads to the netlist representation of the modified FPU 14 can be performed automatically by a software program executed on a computer system as this modification is a graph manipulation for which well-known algorithms exist. The inputs that have to be provided for this program besides the netlist of the FPU 10 are the input signals 200, 201, 202, 203, 210, 211, 212, 213 and the output signals 220, 221, 222, 223, 224, 225, 226, 227 of the multiplier 13.

The state of the art modification technique described above allows to mask out the multiplier 13 from the FPU 10 and to verify the modified FPU 14 separately. The modified FPU 14 can be verified by a model checker that treats the outputs 230, 231, 232, 233, 234, 235, 236, 237 of the random variable building block 15 as an integer number. This integer number is the concatenation of the output signals 230, 231, 232, 233, 234, 235, 236, 237 into a binary number by using a signal value of either 0 or 1 for each of the signals 230, 231, 232, 233, 234, 235, 236, 237. For example, the signal values can be 1, 0, 1, 0, 1, 0, 1, 0 for each of the signals 230, 231, 232, 233, 234, 235, 236, 237, 238 respectively such that the binary number is 10101010. Since the signals 230, 231, 232, 233, 234, 235, 236, 237 are the outputs of the random variable building block 15, the model checker treats the signals as all possible 8-digit binary numbers.

The model checker is now used to perform a functional formal verification of the implementation of the FPU 10 against a design specification. The temporal logic properties used for the verification of the FPU 10 can be derived manually from a design specification document for the FPU 10. The temporal logic formulas and the netlist representation of the modified FPU 14 are used as an input for the model checker. If a temporal logic property is not fulfilled, then the model checker presents a counterexample for the modified FPU 14.

The signal value list of the counterexample comprises the signal values for all the signals within the modified FPU 14 including the input signals of the modified FPU 14 and the concrete signal values for the output signals 230, 231, 232, 233, 234, 235, 236, 237 of the random value building block 15 for every cycle until the temporal property is not fulfilled.

The counterexample is used to generate a test case for a logic simulation of the unmodified netlist representation of the FPU 10. For the test case the signal values for the input signals of the modified FPU 14 have to be taken from the counterexample at a specific cycle, the start cycle. The input signal values for the multiplier input signals 200, 201, 202, 203, 210, 211, 212, 213 need to be determined from the signal values of the output signals 230, 231, 232, 233, 234, 235, 236, 237 of the random variable building block 15. The signal values for the output signals 230, 231, 232, 233, 234, 235, 236, 237 of the random value building block 15 have to be taken from the counterexample at a specific cycle, the multiplier result cycle.

For the preferred embodiment of the invention the multiplier result cycle and the start cycle need be determined manually from the logic design specification document of the FPU 10, and provided as an input for the method. In other embodiments these two cycles can be determined automatically from the counterexample by using a set of properties, e.g. specific signal values, which must be fulfilled at certain cycles.

The signal values of the input signals of the modified FPU 14 at the start cycle, and the signal values of the output signals 230, 231, 232, 233, 234, 235, 236, 237 of the random variable building block 15 at the multiplier result cycle can be extracted from the counterexample by using a program interface that delivers the signal value for a given signal at a given cycle.

For the present invention the signal values for the input signals 200, 201, 202, 203, 210, 211, 212, 213 of the multiplier 13 are determined from the signal values of the output signals 230, 231, 232, 233, 234, 235, 236, 237 of the random value building block 15. In order to achieve this, the signal values of the output signals 230, 231, 232, 233, 234, 235, 236, 237 of the random value building block 15 are treated as an integer number N as described above. This integer number N is factorised into its prime factors. The factorisation can be performed automatically by a program executed on a computer system using well-known algorithms, e.g. the Pollard-Rho algorithm described in J. M. Pollard "A Monte Carlo Method for Factorization", BIT 15(1975), pp. 331-334. As a time saving method, a prime number test can be performed for the integer number N in a preferred embodiment of the invention. If the integer number N is a prime number, N does not need to be factorised.

The result of the factorisation of N is a list of prime factors and their number of occurrences. If 12 is the integer number N, then its prime factors are 3, 2, 2 because 12=3*2*2; an example list of prime factors is ((2, 2), (3, 1)). The prime factors of N can be divided in two groups, e.g. (2, 3) and (2) for the integer number 12. For the present invention all possible combinations of dividing the prime factors in two groups are determined; e.g. {(2, 3), (2)} and {(2, 2), (3)} for the integer number 12.

These combinations are determined in a brute-force approach, which is feasible since typical multipliers have at most 64 input signal values and therefore a relatively small maximum number of 2*64=128 prime factors. The brute force approach works such that all integer factors of N are computed from the prime number factorisation of N. Let $$p:=((f\_1, o\_1), \ldots, (f\_n, o\_n))$$

be a list of prime numbers, and f_i and o_i be the number of occurrences of these prime numbers in the list. Then $$F(p):=(f\_1 \text{ to the power of } o\_1)* \ldots *(f\_n \text{ to the power of } o\_n)$$

is the factor of the list p. Let p be the list of the n prime factors of the integer number N. A new list can be generated from the prime factor list p by replacing an o_i by an integer number in the range from 0 to o_i. Let F__1, ..., F_m be the factors of all these possible lists.

Obviously, the list factors F__1, ..., F_m are all the integer number factors of N and can be computed by a program running on a computer system from the list p. Now a pair (F_i, F_j) is searched such that N=F_i*F_j. For the first pair (F_i, F_j) that is found, F_i is treated as a concatenation of signal values of the signals 200, 201, 202, 203 of the multiplier 13, and F_j is treated as a concatenation of signal values of the signals 210, 211, 212, 213 of the multiplier 13. This delivers a list of signal values for the signals 200, 201, 202, 203, 210, 211, 212, 213 of the multiplier 13. These signal values are now used together with other signal values for signals from the counterexample as a test case for a logic simulation of the unmodified FPU 10 in order to obtain all the information required to understand the design error completely.

Figure 3:
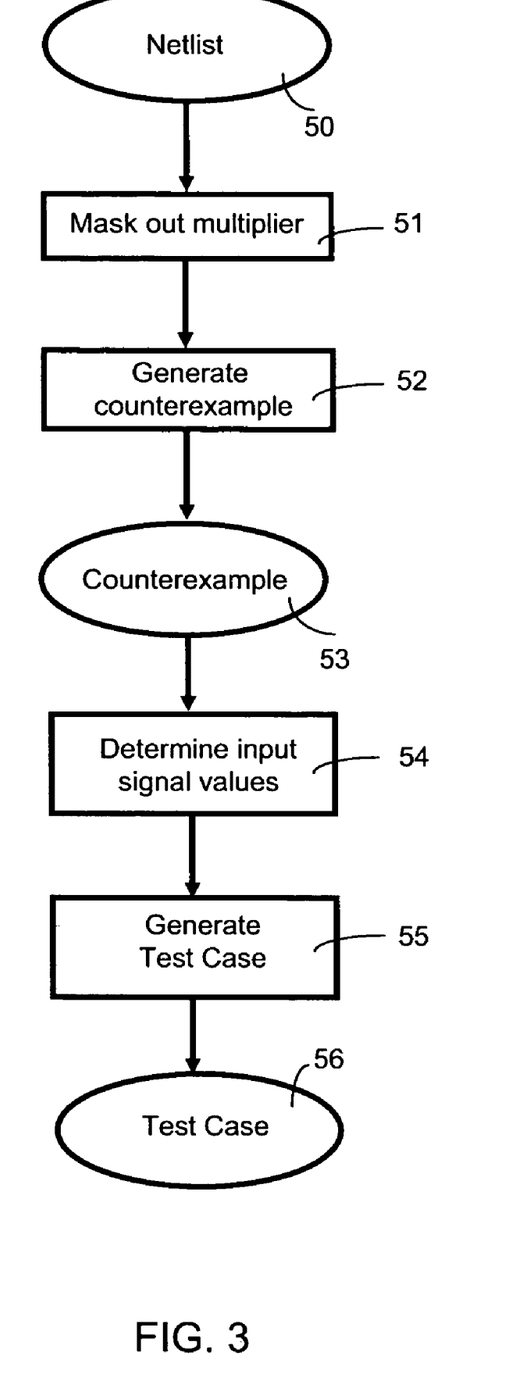
FIG. 3: Is a flow chart of a method in accordance with the invention.

FIG. 3 summarizes the steps described above. The netlist 50 representation of the FPU 10 is modified (step 51) such that the multiplier 13 is masked out and replaced by the pseudo-inputs 230, 231, 232, 233, 234, 235, 236, 237. The modified netlist will be verified by a model checker, which produces (step 52) a counterexample 53 in case a design error i's found. From this counterexample 53 the input signal values of the multiplier 13 are determined (step 54), which are used to generate (step 55) a test case 56 for a logic simulation system.

Figure 4:
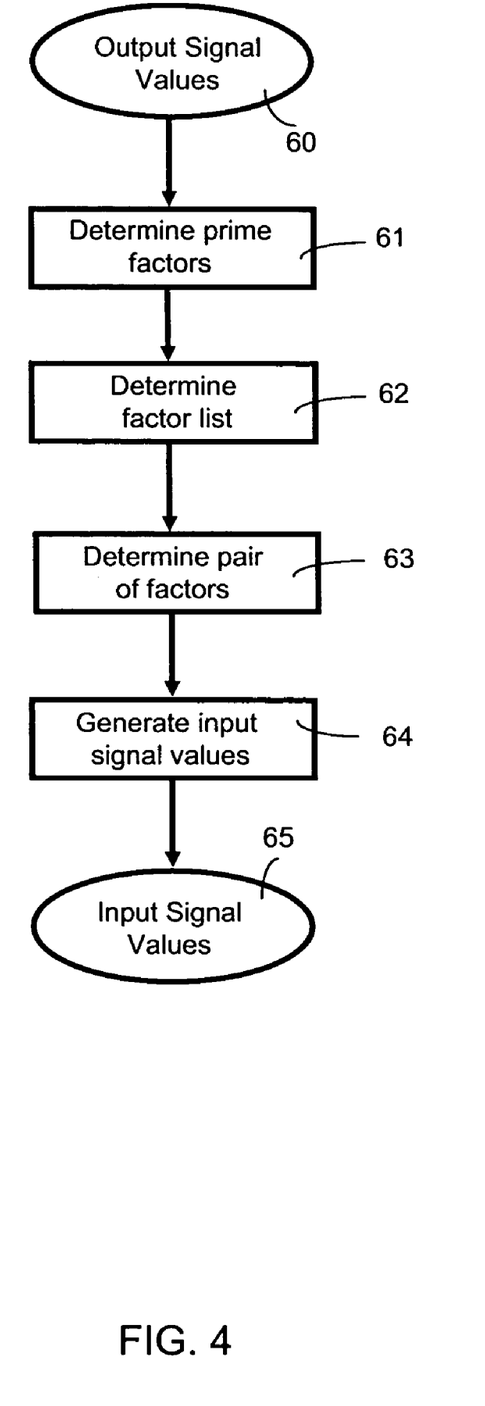
FIG. 4: Is a flow chart of a method in accordance with the invention.

The determination (step 54) of the input signal values of the multiplier 13 is shown in FIG. 4. The output signal values 60 of the random variable 15 are treated as an integer number N, for which the prime factors are determined (step 61). The prime factors of N are used to generate a list F__1, ..., F_m of all integer factors of N (step 62). From this list a pair (F_i, F_j) of integer factors of N is searched, such that N=F_i*F_j (step 63). This pair is used to generate (step 64) corresponding input signal values 65 for the multiplier.

In a preferred embodiment of the present invention, a pair of factors (F_i, F_j) that fulfils a set of additional properties besides N=F_i*F_j is searched in the list of factors F__1, ..., F_m. An example for such a constraint is that F_i and F_j have to be mantissas of normal or denormal (subnormal) floating point numbers N_i and N_j as defined in the IEEE 754 standard. If F_i and F_j are both mantissas of normal numbers, then 1<=F_i*F_j<4. If F_i and F_j are both mantissas of denormal numbers, then 0<F_i*F_j<1. If either F_i or F_j are a mantissa of a denormal number, then 0<F_i*F_j<2. Since the exponential part of a denormal number is 0, it can be determined if N_i and N_j are normal or denormal from the exponential part of N_i and N_i at the start cycle in the counterexample.

In order to determine the constraints, the signals representing the exponential parts of the floating point numbers that will be multiplied have to be known. These signals do not have to be in the cone-of-influence for the multiplier inputs as they do not contribute to the mantissa multiplication. Therefore they are part of the netlist representation of the modified FPU 14.

Another example for constraints is related to the precision of the floating point numbers that get multiplied. The IEEE 754 standard defines different precisions such as single precision, double precision, etc. Associated constraints can be derived from the processor instruction set code for the multiplication operation that gets handled by the FPU 10. This code is represented by signal values of certain signals in the modified FPU 14 and can therefore be found in the counterexample.

In case there is no pair (F_i, F_j) in the list of factors of N that fulfils the constraints, then another counterexample for the same design error can be used. Some model checkers allow specifying the maximum number of counterexamples that will be produced. It is not guaranteed that more than one counterexample exists for the same design error, but the likelihood increases with the number of binary digits used for the floating point numbers. For real-world examples for the FPU 10, it can therefore be assumed that another counterexample can always be found.

The invention is not restricted to hardware designs including a multiplier. It can be used to replace any part of a netlist that cannot be verified easily using functional formal verification. Such a part gets replaced by another netlist that is suitable to model the behaviour of the replaced parts in a formal verification tool, and for which a method exists to deliver signal values for the input signals of the netlist from the signal values of the output signals of the netlist.

This invention is preferably implemented as software, a sequence of machine-readable instructions executing on one or more hardware machines. While a particular embodiment has been shown and described, various modifications of the present invention will be apparent to those skilled in the art.

The invention claimed is:

1. A computer-implemented method comprising:
   providing a first netlist, wherein a subset of the first netlist includes a plurality of inputs and a plurality of outputs and wherein the subset is an arithmetic circuit;
   modifying the first netlist to obtain a second netlist by replacing the subset with a random value generator and associating the random value generator with the outputs such that the random value generator supplies random values to the outputs;
   identifying a testing counterexample using the second netlist, wherein the testing counterexample is associated with particular values of the outputs;
   generating, for the inputs of the subset, a set of input values corresponding to said particular values of the outputs such that the input values represent operands to an arithmetic operation and said particular values of the outputs represent a result of the arithmetic operation; and
   verifying the first netlist using the generated set of input values.

2. The method of claim 1, wherein generating the set of input values includes determining appropriate operands to the arithmetic operation that yield a result of the arithmetic operation corresponding to said particular values of the outputs.

3. The method of claim 2, wherein the arithmetic operation is multiplication.

4. The method of claim 2, wherein generating the set of input values includes factoring into a plurality of factors the result corresponding to said particular values of the outputs.

5. The method of claim 4, wherein the factoring includes:

decomposing into prime factors the result corresponding to said particular values of the outputs;

partitioning the prime factors into a plurality of sets, wherein each of the plurality of sets has a cardinality of at least one; and calculating the multiplicative product of each of the plurality of sets to obtain the plurality of factors.

6. The method of claim 5, wherein the plurality of sets consists of two sets.

7. A computer program product in a computer-readable medium, comprising computer-executable instructions for performing actions that include:

providing a first netlist, wherein a subset of the first netlist includes a plurality of inputs and a plurality of outputs and wherein the subset is an arithmetic circuit;

modifying the first netlist to obtain a second netlist by replacing the subset with a random value generator and associating the random value generator with the outputs such that the random value generator supplies random values to the outputs;

identifying a testing counterexample using the second netlist, wherein the testing counterexample is associated with particular values of the outputs;

generating, for the inputs of the subset, a set of input values corresponding to said particular values of the outputs such that the input values represent operands to an arithmetic operation and said particular values of the outputs represent a result of the arithmetic operation; and verifying the first netlist using the generated set of input values.

8. The computer program product of claim 7, wherein generating the set of input values includes determining appropriate operands to the arithmetic operation that yield a result of the arithmetic operation corresponding to said particular values of the outputs.

9. The computer program product of claim 8, wherein the arithmetic operation is multiplication.

10. The computer program product of claim 9, wherein generating the set of input values includes factoring into a plurality of factors the result corresponding to said particular values of the outputs.

11. The computer program product of claim 10, wherein the factoring includes:

decomposing into prime factors the result corresponding to said particular values of the outputs;

partitioning the prime factors into a plurality of sets, wherein each of the plurality of sets has a cardinality of at least one; and calculating the multiplicative product of each of the plurality of sets to obtain the plurality of factors.

12. The computer program product of claim 11, wherein the plurality of sets consists of two sets.

* * * * *